United States Patent
Kasai et al.

(10) Patent No.: US 7,336,124 B2
(45) Date of Patent: Feb. 26, 2008

(54) OPERATIONAL AMPLIFIER, LINE DRIVER, AND LIQUID CRYSTAL DISPLAY DEVICE

(75) Inventors: Toshihiko Kasai, Kasugai (JP); Shinya Udo, Kasugai (JP); Masatoshi Kokubun, Kasugai (JP); Yoshihiro Kizaki, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/448,669

(22) Filed: Jun. 8, 2006

(65) Prior Publication Data

US 2006/0226899 A1 Oct. 12, 2006

Related U.S. Application Data

(62) Division of application No. 10/811,431, filed on Mar. 29, 2004, now Pat. No. 7,081,792.

(30) Foreign Application Priority Data

Oct. 10, 2003 (JP) ............................ 2003-352203

(51) Int. Cl.
*H03F 1/02* (2006.01)
(52) U.S. Cl. .......................... 330/9; 327/307
(58) Field of Classification Search ............... 330/9; 327/124, 307
See application file for complete search history.

(56) References Cited

U.S. PATENT DOCUMENTS 6,448,836 B2   9/2002   Kokubun et al.
6,586,990 B2   7/2003   Udo et al.
6,747,626 B2 *  6/2004   Chiang ........................ 345/98
6,756,842 B2   6/2004   Mehr et al.

FOREIGN PATENT DOCUMENTS

| JP | 11-044872 | 2/1999 |
| JP | 2001-292041 | 10/2001 |
| JP | 2003-060453 | 2/2003 |
| JP | 2003-188861 | 4/2003 |
| JP | 2003-168936 | 6/2003 |

OTHER PUBLICATIONS

Translation of Japanese Notification of Ground for Rejection dated Oct. 2, 2007.

* cited by examiner

*Primary Examiner*—Khanh Van Nguyen
(74) *Attorney, Agent, or Firm*—Arent Fox LLP

(57) ABSTRACT

An operational amplifier capable of offset cancel in a shorter period, as well as a line driver capable of shortening one horizontal period and a liquid crystal display device are provided. In the operational amplifier of the invention, a time necessary for feed back control can be shortened than usual by a constitution that an output voltage VO in one horizontal period H1 which is one horizontal period before is defined as a reference voltage in an offset cancel preparatory period HC2, thereby changing the output voltage VO(2) only by the offset voltage VO(2) by the feed back control. In the line driver of the invention, the operational amplifier not used for the output of display data D1 to D6 conducts offset cancel operation and it is successively shifted on every one horizontal period. Since it is no more necessary to incorporate the offset cancel preparatory period in the output period, one horizontal period can be shortened further.

3 Claims, 13 Drawing Sheets

SCHEMATIC DIAGRAM OF CIRCUIT BLOCK DIRECTED TO SECOND EMBODIMENT

FIG.1 CIRCUIT DIAGRAM OF OPERATIONAL AMPLIFIER DIRECTED TO FIRST EXAMPLE OF FIRST EMBODIMENT

TIMING CHART OF OPERATIONAL AMPLIFIER DIRECTED TO FIRST EXAMPLE OF FIRST EMBODIMENT

FIG.3 CIRCUIT DIAGRAM OF OPERATIONAL AMPLIFIER DIRECTED TO SECOND EXAMPLE OF FIRST EMBODIMENT

FIG.4 SCHEMATIC DIAGRAM OF CIRCUIT BLOCK DIRECTED TO SECOND EMBODIMENT

TIMING CHART OF CIRCUIT BLOCK DIRECTED TO SECOND EMBODIMENT

FIG.6 SWITCH OPERATION TABLE (1) OF OPERATIONAL AMPLIFIER DIRECTED TO SECOND EMBODIMENT

OPERATIONAL AMPLIFIER

|  | A1 | A2 | A3 | A4 | A5 | A6 | A7 |
|---|---|---|---|---|---|---|---|
| H1 | OFFSET CANCEL | D1 | D2 | D3 | D4 | D5 | D6 |
| H2 | D1 | OFFSET CANCEL | D2 | D3 | D4 | D5 | D6 |
| H3 | D1 | D2 | OFFSET CANCEL | D3 | D4 | D5 | D6 |
| H4 | D1 | D2 | D3 | OFFSET CANCEL | D4 | D5 | D6 |
| H5 | D1 | D2 | D3 | D4 | OFFSET CANCEL | D5 | D6 |
| H6 | D1 | D2 | D3 | D4 | D5 | OFFSET CANCEL | D6 |
| H7 | D1 | D2 | D3 | D4 | D5 | D6 | OFFSET CANCEL |
| H8 | OFFSET CANCEL | D1 | D2 | D3 | D4 | D5 | D6 |
| H9 | D1 | OFFSET CANCEL | D2 | D3 | D4 | D5 | D6 |
| ... | ... | ... | ... | ... | ... | ... | ... |

ONE HORIZONTAL PERIOD

FIG.7 CIRCUIT DIAGRAM OF OPERATIONAL AMPLIFIER DIRECTED TO SECOND EMBODIMENT
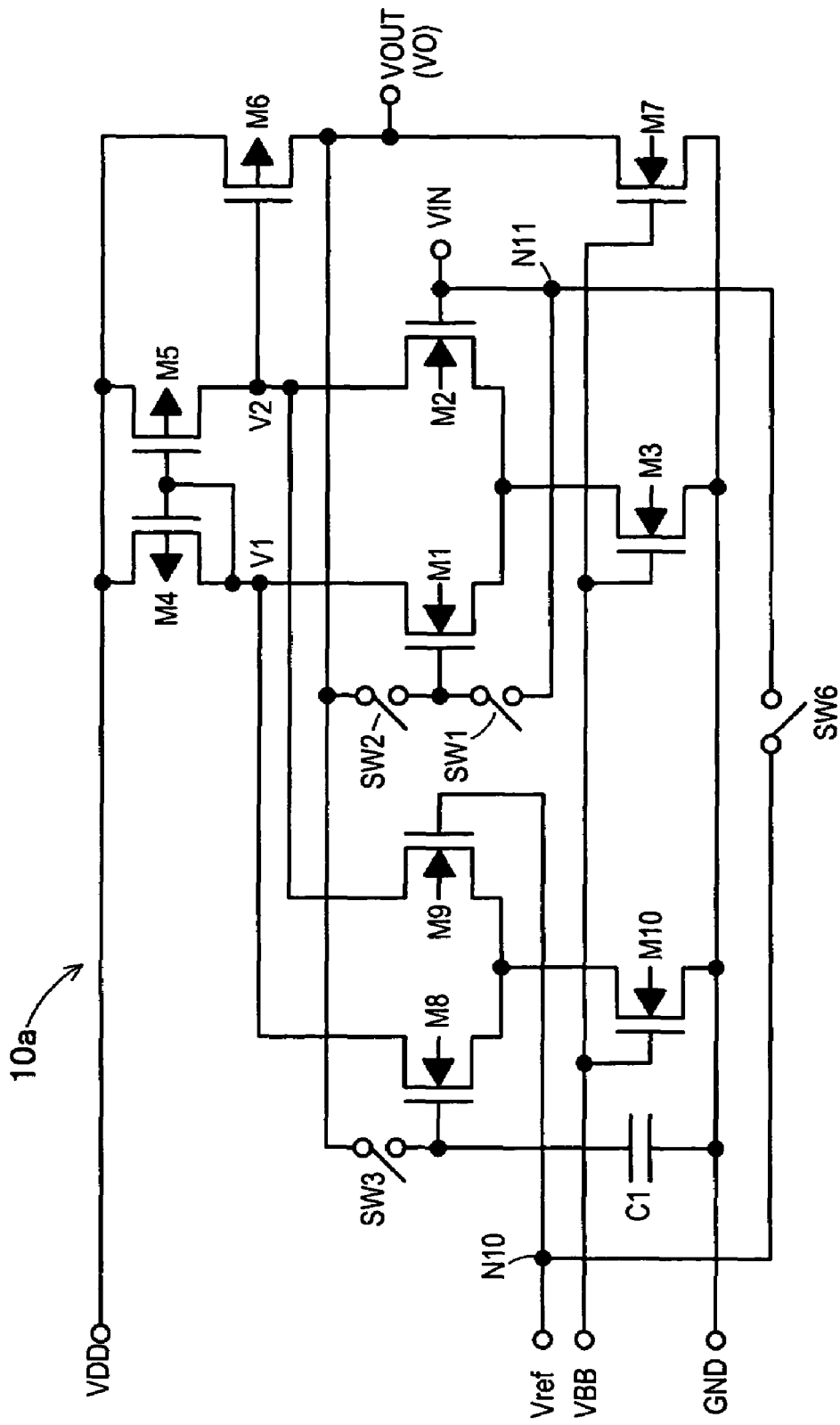

TIMING CHART OF OPERATIONAL AMPLEFIER DIRECTED TO SECOND EMBODIMENT

FIG.9

SWITCH OPERATION TABLE (2) OF OPERATIONAL AMPLIFIER DIRECTED TO SECOND EMBODIMENT

OPERATIONAL AMPLIFIER

| | A1 | A2 | A3 | A4 | A5 | A6 | A7 |
|---|---|---|---|---|---|---|---|
| H1 | OFFSET CANCEL | D1 | D2 | D3 | D4 | D5 | D6 |
| H2 | D1 | OFFSET CANCEL | D2 | D3 | D4 | D5 | D6 |
| H3 | D1 | D2 | OFFSET CANCEL | D3 | D4 | D5 | D6 |
| H4 | D1 | D2 | D3 | OFFSET CANCEL | D4 | D5 | D6 |
| H5 | D1 | D2 | D3 | D4 | OFFSET CANCEL | D5 | D6 |
| H6 | D1 | D2 | D3 | D4 | D5 | OFFSET CANCEL | D6 |
| H7 | D1 | D2 | D3 | D4 | D5 | D6 | OFFSET CANCEL |
| H8 | D1 | D2 | D3 | D4 | D5 | OFFSET CANCEL | D6 |
| H9 | D1 | D2 | D3 | D4 | OFFSET CANCEL | D5 | D6 |
| H10 | D1 | D2 | D3 | OFFSET CANCEL | D4 | D5 | D6 |
| H11 | D1 | D2 | OFFSET CANCEL | D3 | D4 | D5 | D6 |
| H12 | D1 | OFFSET CANCEL | D2 | D3 | D4 | D5 | D6 |
| H13 | OFFSET CANCEL | D1 | D2 | D3 | D4 | D5 | D6 |
| H14 | D1 | OFFSET CANCEL | D2 | D3 | D4 | D5 | D6 |
| ⋮ | ⋮ | ⋮ | ⋮ | ⋮ | ⋮ | ⋮ | ⋮ |

ONE HORIZONTAL PERIOD

CIRCUIT DIAGRAM OF OPERATIONAL AMPLIFIER EQUIPPED WITH CONVENTIONAL OFFSET CANCEL FUNCTION

TIMING CHART OF OPERATIONAL AMPLIFIER EQUIPPED WITH CONVENTIONAL OFFSET CANCEL FUNCTION

SCHEMATIC STRUCTURE OF LIQUID CRYSTAL DISPLAY DEVICE

DIAGRAM SHOWING STRUCTURE OF CONVENTIONAL LINE DRIVER

TIMING CHART ACCOUNTING FOR OPERATION OF CONVENTIONAL LINE DRIVER

OPERATIONAL AMPLIFIER, LINE DRIVER, AND LIQUID CRYSTAL DISPLAY DEVICE

CROSS-REFERENCE TO RELATED APPLICATION

This application is a Divisional Application which claims the benefit of U.S. patent application Ser. No. 10/811,431, filed Mar. 29, 2004 now U.S. Pat. No. 7,081,792, which in turn claims priority to foreign application no. 2003-352203, filed Oct. 10, 2003 in Japan. The disclosures of the prior applications are hereby incorporated by reference herein in their entirety.

BACKGROUND OF THE INVENTION

1. Field of the Invention

The present invention concerns an operational amplifier equipped with an offset cancel function. Further, it also relates to a line driver for a liquid crystal display device equipped with an offset cancel function and a liquid crystal display device 2. Description of Related Art In an operational amplifier, an offset voltage is sometimes generated by scattering of current-voltage characteristics of constitutional transistors. Generation of the offset voltage is not preferred in view of characteristics of the operational amplifier. For example, in a source drive circuit of a liquid crystal display device in which plural operational amplifiers drive plural data lines, the output voltage of the operational amplifier is sometimes different even for an identical input voltage, which causes color shading of displayed images. Accordingly, it is necessary to suppress offset of the operational amplifier.

JP-A No. 2003-168936 discloses an operational amplifier circuit 100 equipped with an offset cancel function as shown in FIG. 10 and a time chart showing the operation of the operational amplifier circuit 100 shown in FIG. 11. In an offset cancel preparatory period from time t1 to time t2 in FIG. 11, switches SW101 and SW103 are turned on, while a switch SW102 is turned off. Since an output voltage VOJ is not fed back to the gate of NMOS transistors M101, and the gate voltage for NMOS transistor M101 and M102 is at an input voltage VIJ, a differential pair input circuit 115 operates as a current source to a current mirror circuit 114. On the other hand, since the output voltage VOJ is fed back to the gate of an NMOS transistor M108, a voltage follower circuit is constituted with the current mirror 114, a differential amplifier circuit comprising a differential pair input circuit 116 and an output buffer circuit 112, to conduct feed back control such that the output voltage VOJ approaches a reference voltage Vref. In this case, voltages V101 and V102 are not equal with each other due to scattering of gate oxide film thickness for MOS transistors to cause offset of displacing the output voltage VOJ from the input voltage VIJ. A capacitor C101 is charged or discharged by output voltage VOJ containing the offset and the voltage of the electrode on the side of the switch SW103 is equal with the output voltage VOJ. That is, the output voltage VOJ is stored into the capacitor C101 in the stable state thereof.

At time t2, when the switches SW101 and SW103 are turned off and the switch SW102 is turned on, operations of the differential pair input circuits 115 and 116 are inversed, and the voltage follower is constituted with the differential amplifier circuit 111 and the output buffer circuit 112, to conduct feed back operation such that the output voltage VOJ approaches the input voltage VIJ. In this case, the gate voltage of the NMOS transistor M108 is equal with the output voltage VOJ at time t2. Even when the operations of the differential pair input circuits 115 and 116 are inversed, since the differential pair input circuits 115 and 116 are connected in parallel with the current mirror 114 and the gate voltage of the NMOS transistors M102, M108 and M109 is equal with the voltage in the stable state just before switching at time t2, feed back control for the voltage of the NMOS transistor M101 is stabilized in a state where it is aligned with the input voltage VIJ which is a voltage just before the switching. That is, the offset voltage is canceled and an output voltage VOJ equal with the input voltage VIJ is outputted.

Further, JP-A No. 2003-168936 discloses the schematic constitution of a liquid crystal display device using an operational amplifier circuit equipped with an offset cancel function as a data driver (line driver) as shown in FIG. 12. In a liquid crystal display panel 120, plural data lines 121 extending in a vertical direction and plural scanning lines 122 extending in a horizontal direction are formed crossing over with each other and pixels are formed corresponding to cross over points respectively. Ends of the data lines 121 and scanning lines 122 are connected, respectively, to a data driver (line driver) 130 and a scanning driver 140 respectively. A control circuit 150 supplies display data signals and clock signals to the data driver (line driver) 130 and supplies scanning control signals to the scanning driver 140 based on video signals, pixel clock signals, horizontal sync signals and vertical sync signals supplied from the outside. The data driver (line driver) 130 outputs display data while converting to voltages of positive polarity and negative polarity relative to the ground voltage GND on every one horizontal scanning period (and on every one pixel). In the data driver (line driver) 130, voltage followers 131 of positive polarity equipped with offset cancel and voltage followers 132 of negative polarity equipped with offset cancel are formed at the output stage thereof, and connected to data lines 121 of the liquid crystal display panel 120 such that the outputs are put to parallel connection or cross over connection by the switching circuit 133 on every adjacent pairs of voltage followers equipped with offset cancel of positive and negative polarities. The voltage follower 131 equipped with offset cancel of positive polarity has an identical constitution with the operational amplifier circuit 100, and the voltage follower 132 equipped with offset cancel of negative polarity has a constitution of replacing the NMOS transistor and the PMOS transistor to each other in the operational amplifier circuit 100.

However, since a reference voltage Vref of a constant value as a reference voltage for canceling the offset of the operational amplifier is used, in a case where the voltage difference between the output voltage VOJ and the reference voltage Vref is large, it takes a much time for conducting feed back control to the output voltage VOJ containing the offset voltage. For this reason, it is necessary to take a long offset cancel preparatory period assuming such a situation. Accordingly, this hinders shortening for the offset cancel preparatory period to bring about a problem.

Further, in the liquid crystal display device, one horizontal period has to be shortened in a case where the number of display lines increases for making the liquid crystal display device finer. However, in the liquid crystal display device in JP-A No. 2003-168936, since the offset cancel preparatory period is present in one horizontal period, shortening for the entire one horizontal period is difficult to bring about a problem.

SUMMARY OF THE INVENTION

The present invention has been made to solve at least one of the problems the above prior art has. Accordingly, it is an object of the present invention to provide an operational amplifier capable of making offset cancel within shorter time, and a line driver and a liquid crystal display device capable of shortening line one horizontal period.

To achieve the object, according to a first aspect of the present invention, there is provided an operational amplifier in which a differential amplifier circuit equipped with a current mirror circuit is incorporated, the operational amplifier comprising: a first switch connected to a portion between an inversion input terminal and a non-inversion input terminal of the differential amplifier circuit; a second switch connected to a portion between an output terminal of the operational amplifier and the inversion input terminal, the second switch controlling conductive state and non-conductive state contrary to the first switch; a differential pair input circuit in which a current path terminal for a first transistor and a current path terminal for a second transistor are connected to a first current terminal and a second current terminal of the current mirror, respectively; a third switch connected to a portion between a gate of the first transistor and an output terminal of the operational amplifier, the third switch being set in conductive state while the first switch is in conductive state and being set in non-conductive state while the first switch is in non-conductive state; a first capacitor connected to a portion between a gate of the first transistor and predetermined voltage; a fourth switch connected to a portion between a gate of the second transistor and the output terminal of the operational amplifier, the fourth switch being set in conductive state for a predetermined length of period while the second switch is in conductive state; and a second capacitor connected to a portion between a gate of the second transistor and predetermined voltage, wherein the operational amplifier has offset cancel function.

According to a second aspect of the present invention, there is provided an operational amplifier in which a differential amplifier circuit equipped with a current mirror circuit is incorporated, the operational amplifier comprising: a first switch connected to a portion between an inversion input terminal and a non-inversion input terminal of the differential amplifier circuit; a second switch connected to a portion between an output terminal of the operational amplifier and the inversion input terminal, the second switch controlling conductive state and non-conductive state contrary to the first switch; a differential pair input circuit in which a current path terminal for a first transistor and a current path terminal for a second transistor are connected to a first current terminal and a second current terminal of the current mirror, respectively; a third switch connected to a portion between a gate of the first transistor and an output terminal of the operational amplifier, the third switch being set in conductive state while the first switch is in conductive state and being set in non-conductive state while the first switch is in non-conductive state; a first capacitor connected to a portion between a gate of the first transistor and predetermined voltage; a fifth switch connected to a portion between a gate of the second transistor and the non-inversion input terminal, the fifth switch being set in conductive state for a predetermined length of period while the second switch is in conductive state; and a second capacitor connected to a portion between a gate of the second transistor and predetermined voltage, wherein the operational amplifier has offset cancel function.

In the operational amplifiers directed to the first and second aspects, an output period is provided while the second switch is set in conductive state and the first and third switches are set in non-conductive state. As predetermined voltage, ground voltage is used, for example. In the operational amplifier directed to the first aspect, the fourth switch is set in conductive state for a predetermined length of period while the second switch is in conductive state period, whereby a voltage value of the output terminal of the operational amplifier is stored in the second capacitor. In the operational amplifier directed to the second aspect, the fifth switch is set in conductive state for a predetermined length of period while the second switch is in conductive state period, wherein a voltage value of the non-inversion input terminal is stored in the second aspect. Duration of the predetermined length of period and its stating timing may be whenever in a period that the second switch is in conductive state. Even if a voltage value of at the output terminal of the operational amplifier or that of the non-inversion input terminal change the most within a conductive state period of the second switch, timing to start setting the fourth or fifth switch in conductive state may be a time point that lapses sufficiently long time for the voltage value after changing to become stable and duration of the predetermined length of period the voltage value after changing may be whatever length as long as it is sufficiently long for the voltage value after changing to be stored. A voltage value the output terminal and that of the non-inversion input terminal are substantially same during an output period. Next, when electrical conduction state of the second switch and either the fourth switch or the fifth switch are shifted to non-conductive state and that of the first and third switches are shifted to conductive state, it goes into an offset preparation period. Since the third switch is in conductive, the voltage value at the output terminal of the operational amplifier is feedback to the gate of the first transistor. Furthermore, the voltage value at the output terminal of the operational amplifier or the voltage value at the non-inversion input terminal before its electrical conduction state changing is stored in the second capacitor and applied to the gate of the second transistor.

Thereby, during an offset cancel preparation period, the voltage value at the output terminal of the operational amplifier is feedback to the gate of the first transistor by the third switch becoming conductive. As a result, it is controlled such that the voltage value at the output terminal of the operational amplifier is substantially same as a voltage value at the second capacitor which is equivalent to the voltage value at the output terminal before electrical conduction state of the output terminal changing. The operational amplifier then serves for operation of a voltage follower. However, during this period, it is controlled such that the first switch is electrically conductive and offset voltage of the differential amplifier circuit is added. Therefore, the voltage value at the output terminal of the operational amplifier is feedback to voltage deviated by offset voltage with reference to the voltage value of the second capacitor. In the prior art, a fixed-valued voltage is used as reference voltage for canceling offset of an operational amplifier. Therefore, in case voltage difference between voltage at the output terminal of the operational amplifier and the fixed-valued voltage is large, it takes long to complete feedback control. Accordingly, the prior art has been required to take an offset cancel preparation period long provided for such situation, which hinders an offset cancel preparation being shortened. However, in the inventive operational amplifier directed to the first and second aspects of the invention, the voltage value of the second capacitor is substantially same as the voltage value at the output terminal of the operational amplifier when feedback control starts. Therefore, time to complete feedback control can be shortened. Accordingly, an offset cancel preparation period can be shortened.

According to the first aspect of the present invention, there is also provided a line driver for amplifying at least one input signal(s) by each input of the input signal every output period that appears repeatedly, the line driver including operational amplifier(s) allocated to respective input signals for amplifying the input signals, each of the operational amplifier(s) being equipped with a differential amplifier circuit in which a current mirror circuit is incorporated, wherein each of the operational amplifier(s) comprises: a first switch connected to a portion between an inversion input terminal and a non-inversion input terminal of the differential amplifier circuit; a second switch connected to a portion between an output terminal of the operational amplifier and the inversion input terminal, the second switch controlling conductive state and non-conductive state contrary to the first switch; a differential pair input circuit in which a current path terminal for a first transistor and a current path terminal for a second transistor are connected to a first current terminal and a second current terminal of the current mirror, respectively; a third switch connected to a portion between a gate of the first transistor and an output terminal of the operational amplifier, the third switch being set in conductive state while the first switch is in conductive state and being set in non-conductive state while the first switch is in non-conductive state; a first capacitor connected to a portion between a gate of the first transistor and predetermined voltage; a fourth switch connected to a portion between a gate of the second transistor and the output terminal of the operational amplifier, the fourth switch being set in conductive state for a predetermined length of period while the second switch is in conductive state; and a second capacitor connected to a portion between a gate of the second transistor and predetermined voltage, and wherein the line driver has offset cancel function.

According to the second aspect of the present invention, there is also provided a line driver for amplifying at least one input signal(s) by each input of the input signal every output period that appears repeatedly, the line driver including operational amplifier(s) allocated to respective input signals for amplifying the input signals, each of the operational amplifier(s) being equipped with a differential amplifier circuit in which a current mirror circuit is incorporated, wherein each of the operational amplifier(s) comprises: a second switch connected to a portion between an output terminal of the operational amplifier and the inversion input terminal, the second switch controlling conductive state and non-conductive state contrary to the first switch; a differential pair input circuit in which a current path terminal for a first transistor and a current path terminal for a second transistor are connected to a first current terminal and a second current terminal of the current mirror, respectively; a third switch connected to a portion between a gate of the first transistor and an output terminal of the operational amplifier, the third switch being set in conductive state while the first switch is in conductive state and being set in non-conductive state while the first switch is in non-conductive state; a first capacitor connected to a portion between a gate of the first transistor and predetermined voltage; a fifth switch connected to a portion between a gate of the second transistor and the non-inversion input terminal, the fifth switch being set in conductive state for a predetermined length of period while the second switch is in conductive state; and a second capacitor connected to a portion between a gate of the second transistor and predetermined voltage, and wherein the line driver has offset cancel function.

Thereby, there can be realized a line driver of which an offset cancel preparation period is shortened. Accordingly, operation speed of a line driver can be heightened.

According to the first aspect of the present invention, there is also provided a liquid crystal display device for applying an image data voltage signal through plural data lines every horizontal period that appears repeatedly, the liquid crystal display device including operational amplifier(s) allocated to respective image data voltage signals for amplifying the input signals, each of the operational amplifier(s) being equipped with a differential amplifier circuit in which a current mirror circuit is incorporated, wherein each of the operational amplifier(s) comprises: a first switch connected to a portion between an inversion input terminal and a non-inversion input terminal of the differential amplifier circuit; a second switch connected to a portion between an output terminal of the operational amplifier and the inversion input terminal, the second switch controlling conductive state and non-conductive state contrary to the first switch; a differential pair input circuit in which a current path terminal for a first transistor and a current path terminal for a second transistor are connected to a first current terminal and a second current terminal of the current mirror, respectively; a third switch connected to a portion between a gate of the first transistor and an output terminal of the operational amplifier, the third switch being set in conductive state while the first switch is in conductive state and being set in non-conductive state while the first switch is in non-conductive state; a first capacitor connected to a portion between a gate of the first transistor and predetermined voltage; a fourth switch connected to a portion between a gate of the second transistor and the output terminal of the operational amplifier, the fourth switch being set in conductive state for a predetermined length of period while the second switch is in conductive state; and a second capacitor connected to a portion between a gate of the second transistor and predetermined voltage, and wherein the liquid crystal display device has offset cancel function.

According to the second aspect of the present invention, there is also provided a liquid crystal display device for applying an image data voltage signal through plural data lines every horizontal period that appears repeatedly, the liquid crystal display device including operational amplifier(s) allocated to respective image data voltage signals for amplifying the input signals, each of the operational amplifier(s) being equipped with a differential amplifier circuit in which a current mirror circuit is incorporated, wherein each of the operational amplifier(s) comprises: a first switch connected to a portion between an inversion input terminal and a non-inversion input terminal of the differential amplifier circuit; a second switch connected to a portion between an output terminal of the operational amplifier and the inversion input terminal, the second switch controlling conductive state and non-conductive state contrary to the first switch; a differential pair input circuit in which a current path terminal for a first transistor and a current path terminal for a second transistor are connected to a first current terminal and a second current terminal of the current mirror, respectively; a third switch connected to a portion between a gate of the first transistor and an output terminal of the operational amplifier, the third switch being set in conductive state while the first switch is in conductive state and being set in non-conductive state while the first switch is in non-conductive state; a first capacitor connected to a portion between a gate of the first transistor and predetermined voltage; a fifth switch connected to a portion between a gate of the second transistor and the non-inversion input terminal, the fifth switch being set in conductive state for a predetermined length of period while the second switch is in conductive state; and a second capacitor connected to a portion between a gate of the second transistor and predetermined voltage, and wherein the liquid crystal display device has offset cancel function.

Thereby, there can be realized a liquid crystal display device equipped with an operational amplifier of which an offset cancel preparation period is shortened. Accordingly, higher definition of a liquid crystal display device can be achieved.

According to the third aspect of the present invention, there is also provided a line driver for amplifying at least one input signal(s) by each input of the input signal every output period that appears repeatedly, the line driver comprising: operational amplifier for amplifying the input signal(s) number of which is larger by at least one than number of the input signal(s); and a switch section for selecting and switching to operational amplifiers in amplification operation by receiving inputs of the input signals, the switch section switching every output period, wherein offset cancellation is made on operational amplifier(s) not selected during the output period.

Each selected operational amplifier to which an input signal is inputted amplifies an input signal by each input of the input signal and outputs an amplified signal. Furthermore, while the selected operational amplifier outputs a signal, offset cancel is made on at least one non-selected operational amplifier to which an input signal is not inputted. The switch section switches the selected operational amplifier to other operational amplifier every output period, and also switches the non-selected operational amplifier to other not to be selected operational amplifier every output period. The switch section is switched such that all of the operational amplifiers are switched to non-selective in turn so that offset cancel is made on all of them. Therefore, it is not required to provide an offset cancel preparation period prior to each output period. Accordingly, it is not necessary to embed an offset cancel period in an output period.

According to the third aspect of the present invention, there is also provided a liquid crystal display device for applying an image data voltage signal through plural data lines every horizontal period that appears repeatedly, the liquid crystal display device comprising: operational amplifiers for amplifying the input signals number of which is larger by at least one than number of the input signal(s); and a switch section for selecting and switching operational amplifiers in amplification operation by receiving inputs of the input signals, the switch section switching every output period, wherein offset cancellation is made on operational amplifier(s) not selected during the output period.

Thereby, there is no need to provide an offset cancel preparation period prior to each output period and one horizontal period can be shortened. Accordingly, higher definition of a liquid crystal display device by increasing the number of lines for display can be achieved.

According to a fourth aspect of the present invention, there is provided an offset cancel circuit alternately conducting offset voltage fetch operation in which an offset value of an operational amplifier is fetched as differential voltage with respect to reference voltage and offset voltage cancel operation in which differential voltage is cancel out from output voltage, wherein, as reference voltage to be used in the offset voltage fetch operation, either input voltage prior to the offset voltage fetching operation or output voltage after offset voltage cancel operation prior to the offset voltage fetching operation is used.

In offset voltage cancel operation, differential voltage is cancelled out from output voltage. After the offset voltage cancel operation, there can be obtained output voltage from which an offset value is cancelled out corresponding to input voltage. Offset voltage fetch operation is a kind of feedback control such that output voltage of an operational amplifier, for example, should include an offset value of the operational amplifier with reference to reference voltage as differential voltage. As reference voltage, input voltage obtained before offset voltage fetch operation or output voltage obtained before offset voltage fetch operation and after offset voltage cancel operation is used. Output voltage obtained after offset voltage cancel operation corresponds to output voltage from which an offset value is cancelled out. Input voltage or output voltage from which an offset value is cancelled out shall be held by mechanism that holds voltage of a capacitor or the like, whereby the voltage held can be used as reference voltage in offset voltage fetch operation.

Since reference voltage is substantially same as an voltage value at the output terminal of the operational amplifier when offset voltage fetch operation starts, time of offset voltage fetch operation can be shortened. Accordingly, an offset voltage fetch operation period can be shortened.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

BRIEF DESCRIPTION OF THE DRAWINGS

FIG. 6 shows switch operation table (1) of an operational amplifier directed to the second embodiment;

FIG. 7 is a circuit diagram of the operational amplifier directed to the second embodiment;

FIG. 9 shows switch operation table (2) of the operational amplifier directed to the second embodiment;

DETAILED DESCRIPTION OF THE PREFERRED EMBODIMENTS

Figure 1:
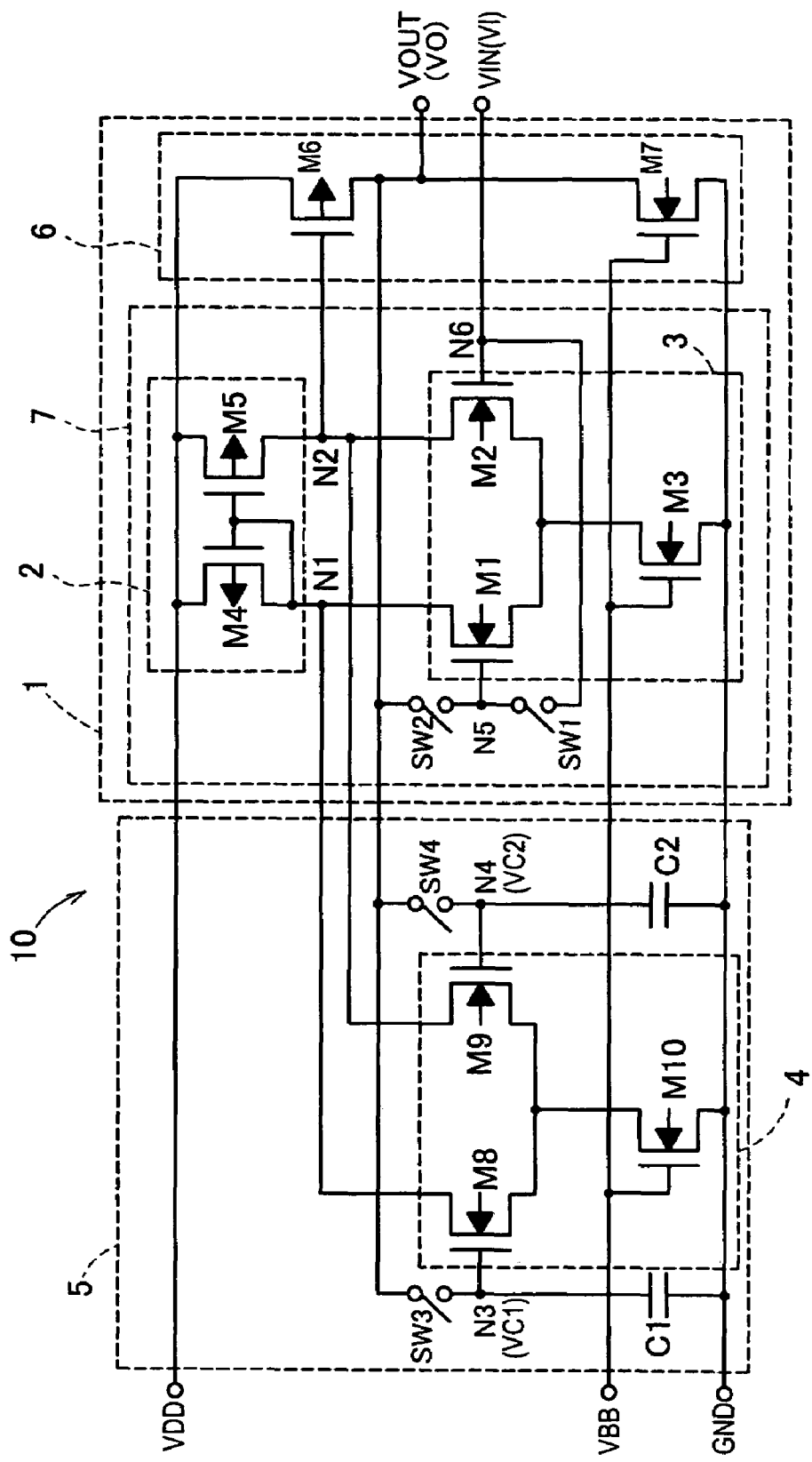
FIG. 1 is a circuit diagram of an operational amplifier directed to a first example of a first embodiment.

Embodiments for an operational amplifier equipped with offset cancel function, a line driver and a liquid crystal display device according to the present invention are to be described in detail with reference to the drawings based on FIG. 1 to FIG. 9. A first example in a first preferred embodiment of the invention is to be described with reference to FIG. 1 and FIG. 2. FIG. 1 shows a circuit diagram for an operational amplifier 10 having an offset cancel circuit of the first embodiment. The operational amplifier circuit 1 comprises a current mirror circuit 2, a first differential pair input circuit 3, and an output buffer circuit 6, and an offset cancel circuit 5 has a second differential pair input circuit 4. The current mirror circuit 2 and the first differential pair input circuit 3 constitute a differential amplifier circuit 7. The first differential pair input circuit 3 and the second differential pair input circuit 4 are connected at a first current terminal N1 and a second current terminal N2 in parallel to the current mirror circuit 2. In the current mirror circuit 2, sources of PMOS transistors M4 and M5 are connected to a power source voltage VDD and gates of the PMOS transistors M4 and M5 are connected to the drain of the PMOS transistor M4. In the differential pair input circuit 3, sources of NMOS transistors M1 and M2 are connected to the drain of an NMOS transistor M3, and the source of the transistor M3 is connected to the ground voltage GND. The NMOS transistor M3 is applied with a bias voltage VBB at the gate and functions as a constant current source. An output buffer circuit 6 comprises a PMOS transistors M6 and an NMOS transistor M7 connected in series between the power source voltage VDD and the ground voltage GND, and the NMOS transistor M7 is applied with a bias voltage VBB at the gate and functions as a constant current source. The drain of the transistor M6 is connected to an output terminal VOUT.

Further, a switch SW1 is connected between an inversion input terminal N5 and a non-inversion input terminal N6, and a switch SW2 is connected between an output terminal VOUT and the inversion input terminal N5 of the operational amplifier respectively. An offset cancel circuit 5 comprises a second differential input circuit 4 of the constitution identical with that of the first differential pair input circuit 3, a first capacitor C1 and a second capacitor C2, and switches SW3 and SW4. One end of the first capacitor C1 is connected at a node N3 with the gate of an NMOS transistor M8 and the other end of the capacitor C1 is connected to the ground potential GND. One end of the second capacitor C2 is connected at the node N4 with the gate of an NMOS transistor M9 and the other end of the capacitor C2 is connected with the ground potential GND. Further, the switch SW3 is connected between the node N3 and the output terminal VOUT, and the switch SW4 is connected between the node N4 and the output terminal VOUT, respectively.

Figure 2:
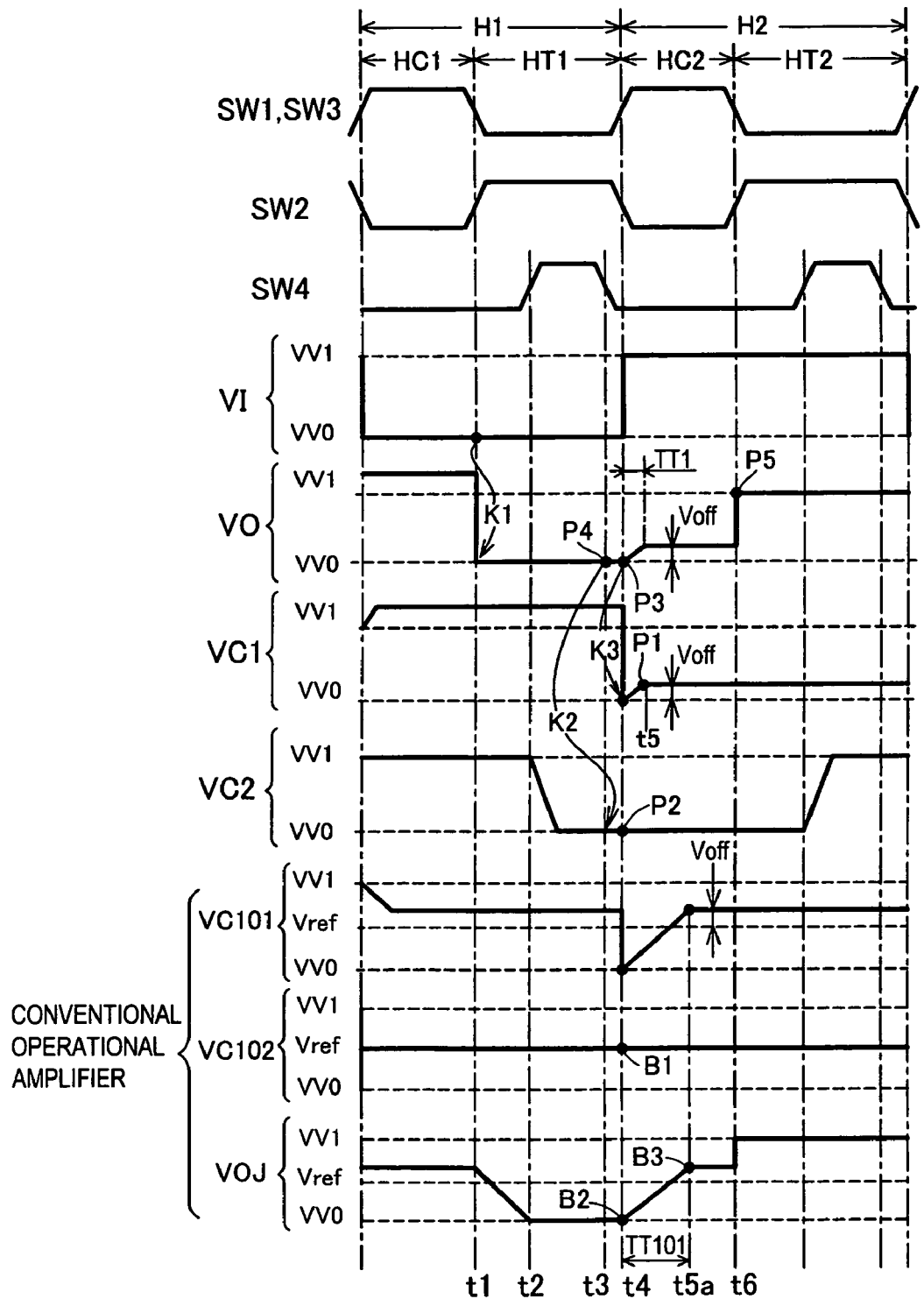
FIG. 2 is a timing chart of the operational amplifier directed to the first example of the first embodiment.

Then, the operation is to be described. FIG. 2 is a timing chart. The operational amplifier 10 equipped with offset cancel function of the invention has an offset cancel preparatory period HC1 and an output period HT1 in one horizontal period H1 and repeats horizontal periods like H1, H2, - - - . Further, the output voltage in one horizontal period Hn is defined as an output voltage VO(n) and an input voltage is defined as an input voltage VI(n). Further, the voltages at the nodes N3, N4 in the operational amplifier 10 of the invention are defined as VC1 and VC2, while the voltages at the nodes N103 and N104 in the existent operational amplifier 100 are defined as VC101, and VC102. At time t1 in the output period HT1 in FIG. 2, the switch SW2 is turned on, and the switches SW1 and SW3 are turned off. Further, the switch SW4 is in the off state. In this case, since the offset is canceled by the principle to be described later, the voltage value for the output voltage VO(1) has a value equal with the voltage value VV0 of the input voltage VI(1) (arrow K1 in FIG. 2).

Then, from time t2 to time t3, an operation of storing the voltage value VV0 of the output voltage VO(1) in the output period HT1 to the second capacitor C2 is conducted. That is, at time t2, the switch SW4 is turned on to render the second capacitor C2 and the output terminal VOUT conductive. Since the voltage value VV0 of the output voltage VO(1) is stored in the second capacitor C2, the voltage VC2 at the node N4 is also at a voltage value VV0. Then, at time t3 after lapse of a predetermined period. The switches SW4 is turned off to render the second capacitor C2 and the output terminal VOUT non-conductive. This stores the voltage value VV0 of the output voltage VO(1) in the output period HT1 into the second capacitor C2 (arrow K2 in FIG. 2).

It is necessary that the predetermined period from time t2 to time t3 has a sufficient length capable of completing charge/discharge also when the amount of change of the voltage value stored in the second capacitor C2 is greatest and this is a value determined, for example, by the capacitance of the second capacitor C2, the swing range for the voltage value of the input voltage VO and the wiring capacitance. The timing for on and off of the switch SW4 may be within the output period HT, and the time after lapse of a sufficient period to stabilize the voltage value after change even when the voltage value on the output terminal of the operational amplifier changes most greatly within the output period HT may be defined as a time for starting the period in which the switch SW4 is in the on state, and a period sufficient to store the voltage value after the change in the second capacitor C2 may be defined as a length for the period in which the switch SW4 is kept on.

Then, at time t4, it goes to the offset cancel preparatory period HC2 in one horizontal period H2. In one horizontal period H2, an input voltage VI(2) for one horizontal period H2 (voltage value VV1) is applied to the input terminal VI(2). Then, in FIG. 1, the switches SW1, SW3 are turned on and the switch SW2 is turned off. The switch SW4 is in the off state. In the offset preparatory period HC2, identical input voltage VI(2) is applied to both gates of the transistors M1, M2 by the conduction of the switch SW1 and the output is fed back from the drain of the transistor M6 to the gate of the transistor M8 by the conduction of the switch SW3. Further, the voltage value VVO of the output voltage VO(1) during the output period HT1 stored in the second capacitor C2 is applied to the gate of the transistor M9.

In a case where gate-source voltage/drain current characteristics of the transistors M1, M2 scatters, even when the identical input voltage VI(2) (voltage value VV1) is applied to the gates of both transistors, drain currents caused thereby are different. For instance, if the scattering is such that the current driving performance of the transistor M2 is higher, the drain current of the transistor M2 is greater than the drain current of the transistor M1. It is assumed here that the values of the currents flowing to the first current terminal N1 and the second current terminal N2 of the current mirror circuit 2 are equal. The voltage VC1 at the node N3 as the gate voltage value of the transistor M8 is fed back such that a drain current to absorb the different drain currents caused by scattering of the characteristics between the transistors M1, M2 flows to the transistors MB, M9 (such that the total value for the drain currents of the transistors M1, M8 is equal with the total value for the drain currents of the transistors M2, M9).

Then, in the stable state at time t5, the voltage VC1 at the node N3 is set to a voltage offset by an offset voltage Voff with reference to the voltage VC2 at the node N4 (stored output voltage VO(1) (voltage value VV0)) (voltage VC2 at node N4 (voltage value VV0)+offset voltage Voff) (point P1 in FIG. 2) and identical currents flow to the first current terminal N1 and the second current terminal N2 to attain the stable state. Then, the voltage VC1 containing the offset voltage at the node N3 is stored in the capacitor C1. That is, an offset drain current in a state where an identical input voltage VI(2) (voltage value VV1) is applied to the gates of the transistors M1 and M2 is stored in the offset cancel circuit 5.

In the timing chart shown in FIG. 2, description is to be made in comparison for the stabilization period TT1 of the voltage VC1 at node N303 in the operational amplifier 10 of the invention and the stabilization period TT101 of the voltage VC101 at the node N103 in the existent operational amplifier 100. At time t4, when the switch SW3 is turned on, the node N3 and the output terminal VOUT are rendered conductive. Since the output terminal VOUT is connected with various circuits and has larger load, the voltage VC1 on the node N3 at time t4 is output voltage VO(1) of the output terminal VOUT (voltage value VV0) (arrow K3 in FIG. 2). Then, since the output voltage VO(2) is put to feed back control from the voltage value VV0 as a starting point to "voltage offset by an offset voltage Voff relative to the voltage VC2 at the node N4 as a reference voltage", and identical current flows to the first current terminal N1 and the second current terminal N2 to attain a stable state. Since output terminal VOUT is connected to various loads, in a case of changing the voltage value of the output voltage VO(2) greatly, it requires a long stabilization time till the stabilization of the voltage value, but when the stabilization time is long, the offset cancel preparatory period HC2 can not be shortened to bring about a problem. That is, it is important to adopt a method of not greatly changing the voltage value of the output voltage VO(2) in the offset cancel preparatory period HC2.

In the operational amplifier 10 of the invention, the reference voltage (voltage VC2 on the node N4 at time t4) is an output voltage VO(1) stored in the second capacitor C2 (voltage value VV0) (point P2 in FIG. 2). Further, the voltage value of the output voltage VO(2) at the starting point for the offset cancel preparatory period HC2 is also VV0 (point P3 in FIG. 2). Accordingly, since both of them are equal, conducting feed back control of the output voltage VO(2) by "voltage offset by offset voltage Voff" starting from the voltage value VV0 as the starting point, a time necessary for stabilization (stabilization time TT1) may be short and stabilization is completed at time t5.

On the other hand, in the existent operational amplifier 100, the reference voltage (the voltage VC102 on the node N104 at time t4) is a reference voltage Vref as a constant voltage (point B1 in FIG. 2). Further, the output voltage VOJ(2) at the offset cancel starting point is at a voltage value VV0 (point B2 in FIG. 2). Accordingly, when the voltage value VV0 and the voltage value Vref are different greatly, it is necessary to conduct feed back control for the output voltage VOJ(2) starting from the voltage value VV0 to "voltage offset by the offset voltage Voff with the reference voltage Vref being as a reference voltage (Vref+Voff)" (point B3 in FIG. 2). In this case, the time necessary for stabilization (stabilization time TT101) is longer compared with the stabilization time TT1 in the invention and stabilization is completed finally at time t5a.

That is, in the invention, the time necessary for the feed back control is shortened than usual by adapting such that the output voltage VO(2) may be changed by the feed back control by so much as the offset voltage Voff, by adapting the reference voltage in the offset cancel preparatory period HC2 (point P2, voltage VC2 at node N4) as the output voltage VO in one horizontal period H1 which is one horizontal period before (P4 in FIG. 2). On the other hand, in the existent operational amplifier, since the reference voltage is constant (voltage value Vref), in a case where the voltage of the output voltage VOJ(2) at the starting time for the offset cancel preparatory period (point B2 in FIG. 2) and the reference voltage (point B1 in FIG. 2) are different greatly, the output voltage VO(2) has to be changed to the vicinity of the reference voltage value Vref, and it takes a longer time by so much for the feed back control.

It is considered here such a case that the through rate in the feed back control for the output voltage (amount of voltage changed per unit time)=1.8 (V/µs), the voltage value of the offset voltage Voff=0.4 (V), the reference voltage Vref=7.6(V), voltage value VV0=5.7 (V), and voltage value VV1=9.9(V). In the existent operational amplifier 100, the output voltage VOJ has to be changed by 2.3(V) starting from the voltage value VV0 (5.7 V) to the reference voltage Vref (7.6 (V)+offset voltage Voff (0.4 (V)) and 1.28 (µs) is necessary for the stabilization time TT101 when calculated based on the through rate. On the other hand, in the operational amplifier 10 according to the invention, since the voltage VC1 may be changed by so much as the offset voltage value Voff (0.4 (V)) starting from the voltage value VV0, it can be seen that the stabilization time TT1 can be shortened to 0.22 (µs), that is, by about ⅙.

Further, after the completion of the stabilization period, when it goes to time t6, it enters the output period HT2 in which the switch SW2 is turned on, and switches SW1, SW3 are turned off in FIG. 1. The switch SW4 is in the off state. At the gates of the transistors M8 and M9, a voltage identical with that in the offset cancel preparatory period HC2 corresponds to the difference of the current driving performance between the transistors M1 and M2 is maintained by the first capacitor C1 and the second capacitor C2. Accordingly, the drain current flowing to the transistors M8, M9 flow so as to absorb the difference of the drain currents flowing to the transistors M1 and M2. That is, assuming that values of the current flowing to the first current terminal M1 and the second current terminal M2 of the current mirror circuit 2 are identical, the currents flow such that the total amount of the drain currents in the transistors M1 and M8 and the drain currents in the transistors M2, M9 are equal. Since this is the state where the voltages on the inversion input terminal N5 and the non-inversion input terminal N6 are equal, the output voltage VO(2) at the output terminal VOUT stabilizes at a voltage value W1 equal with the input voltage VI(2) on the input terminal VIN (point P5 in FIG. 2). That is, offset cancel is conducted.

Figure 3:
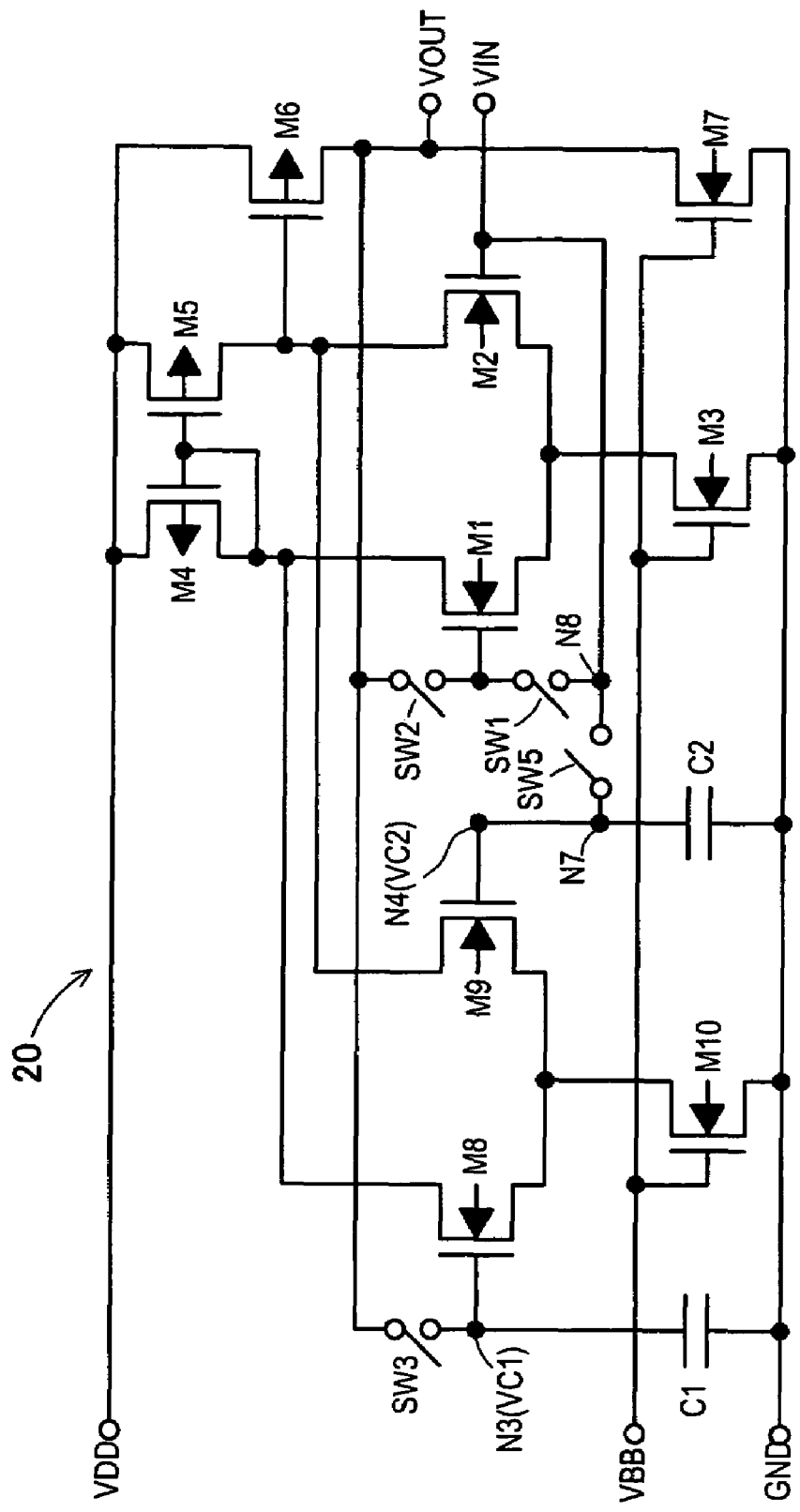
FIG. 3 is a circuit diagram of an operational amplifier directed to a second example of a first embodiment.

Further, an operational amplifier 20 equipped with offset cancel circuit of a second example of the first embodiment according to the invention is to be described with reference to FIG. 3. The operational amplifier 20 has a node N7 disposed between a node N4 and a second capacitor C2, and a node N8 disposed between a switch SW1 and an input terminal VIN and has a switch SW5 connecting both of the nodes. Since other constitutions than described above are identical with those in the operational amplifier 10 in the first example, duplicate descriptions will be omitted. Further, the operation of the switch SW5 is identical with the operation of the switch SW4 in the operational amplifier 10 of the first example.

Thus, the reference voltage (voltage VC2 on node N4) can be defined as an input voltage VI one horizontal period before instead that in the operational amplifier 10 in the first example in which the reference voltage is an output voltage VO one horizontal period before. Accordingly, the operational amplifier 20 also has a constitution that the output voltage VO may be changed through the feed back control by the offset voltage Voff, and the feed back control time in the offset cancel preparatory period can be shortened more than usual.

The second differential pair input circuit 4 is a differential pair input circuit, the transistor M8 is a first transistor, a transistor M9 is a second transistor and a ground voltage GND is a predetermined voltage, respectively.

In the operational amplifier of the invention, in a case where the offset cancel period is kept identical with that in the existent operational amplifier, since the amount of voltage to be changed by the feed back control in an identical period is smaller in the operational amplifier of the invention, the consumption current can be reduced. For example, as has been described for the first example, when the change is conducted through the feed back control, within the stabilization period TT101 (1.28 (µs)), by the reference voltage value Vref+offset voltage Voff (1.28 (V)) in the existent operational amplifier and by the offset voltage Voff (0.4 (V)) in the present invention, respectively, as has been described for example for the first example, the current consumed in the existent operational amplifier is 17 (µA) and 11.5 (µA) in the operational amplifier of the invention, and the consumption current is decreased by 30%.

As described above, according to the operational amplifier in the first embodiment of the invention, in the offset cancel preparatory period HC, the voltage value VO on the output terminal VOUT is fed back to the gate of the transistor M8 by the conduction of the switch SW3, and controlled so as to be substantially equal with the voltage value on the second capacitor C2 in which the voltage value on the output terminal before the change of state is possessed. In this period, the switch SW1 is conducted and the offset voltage of the differential amplifier circuit 7 is added and controlled. Accordingly, the voltage value VO on the output terminal VOUT is feed back controlled to a voltage offset by the offset voltage relative to the voltage value of the second capacitor C2. Accordingly, since the voltage value on the second capacitor C2 and the voltage value on the output terminal VOUT at the time starting the feed back control are substantially equal, the time till the completion of the feed back control can be shortened. Accordingly, the offset cancel preparation period HC can be shortened.

Figure 12:
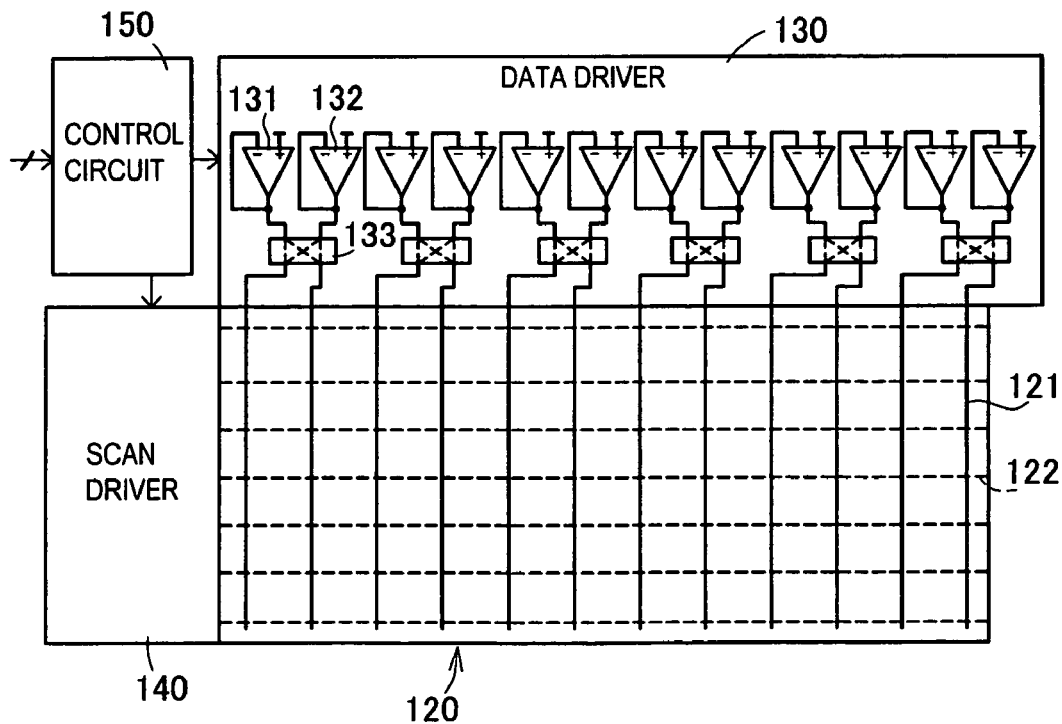
FIG. 12 is a view showing schematic structure of a liquid crystal display device.
Figure 13:
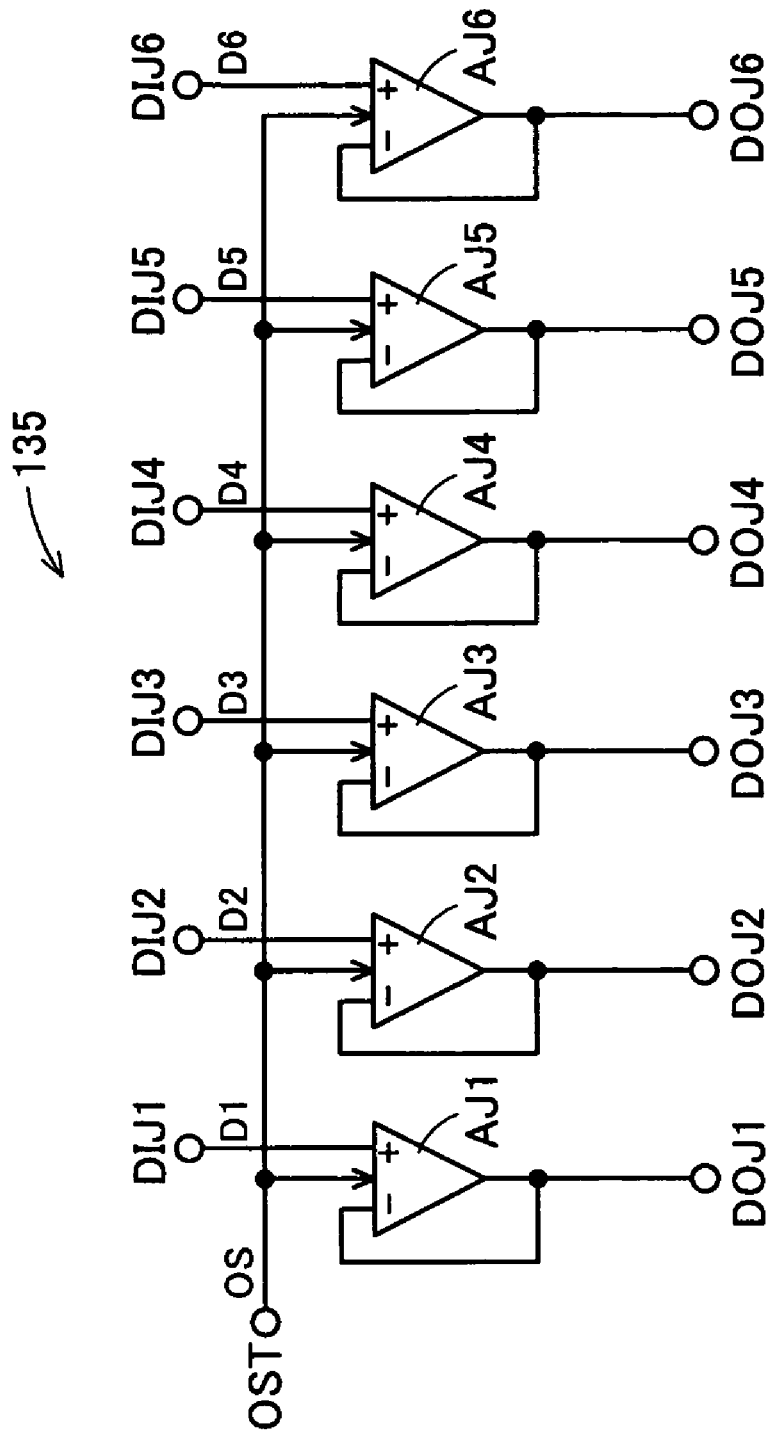
FIG. 13 is a diagram showing structure of a conventional line driver.

A second embodiment for a liquid crystal display device driving circuit and a liquid crystal display device using the operational amplifiers of the invention are to be described. A method of constituting voltage followers 131 equipped with offset cancel in a line driver 130 in a liquid crystal display device as shown in FIG. 12 is extracted and schematically shown in FIG. 13. In the line driver 130, plural input and output terminal are arranged in one block and the blocks are arranged by the number corresponding to the number of pixels to constitute the line driver 130. FIG. 13 shows a block 135 having 6-input and 6-output as an example. The block 135 has data input terminals DIJ1 to DIJ6 and data output terminals DOJ1 to DOJ6. Display data D1 to D6 are inputted from a control circuit 150 (FIG. 12) to the data input terminals DIJ1 to DIJ6, and outputted from the data output terminals DOJ1 to DOJ6 to respective corresponding data lines 121. Further, operational amplifiers AJ1 to AJ6 that operate as voltage followers are provided on every input and output terminals between the data input terminals DIJ1 to DIJ6 and the data output terminals DOJ1 to DOJ6. The data inputted from the data input terminal DIJ1 is inputted to the non-inversion input of the operational amplifier AJ1 and the data outputted from the output of the operational amplifier AJ1 is outputted by way of the data output terminal DOJ1 to the data line 121 (FIG. 12). Further, an offset cancel control signal OS is inputted by way of an offset cancel control signal input terminal OST to the operational amplifiers AJ1 to AJ6.

Figure 10:
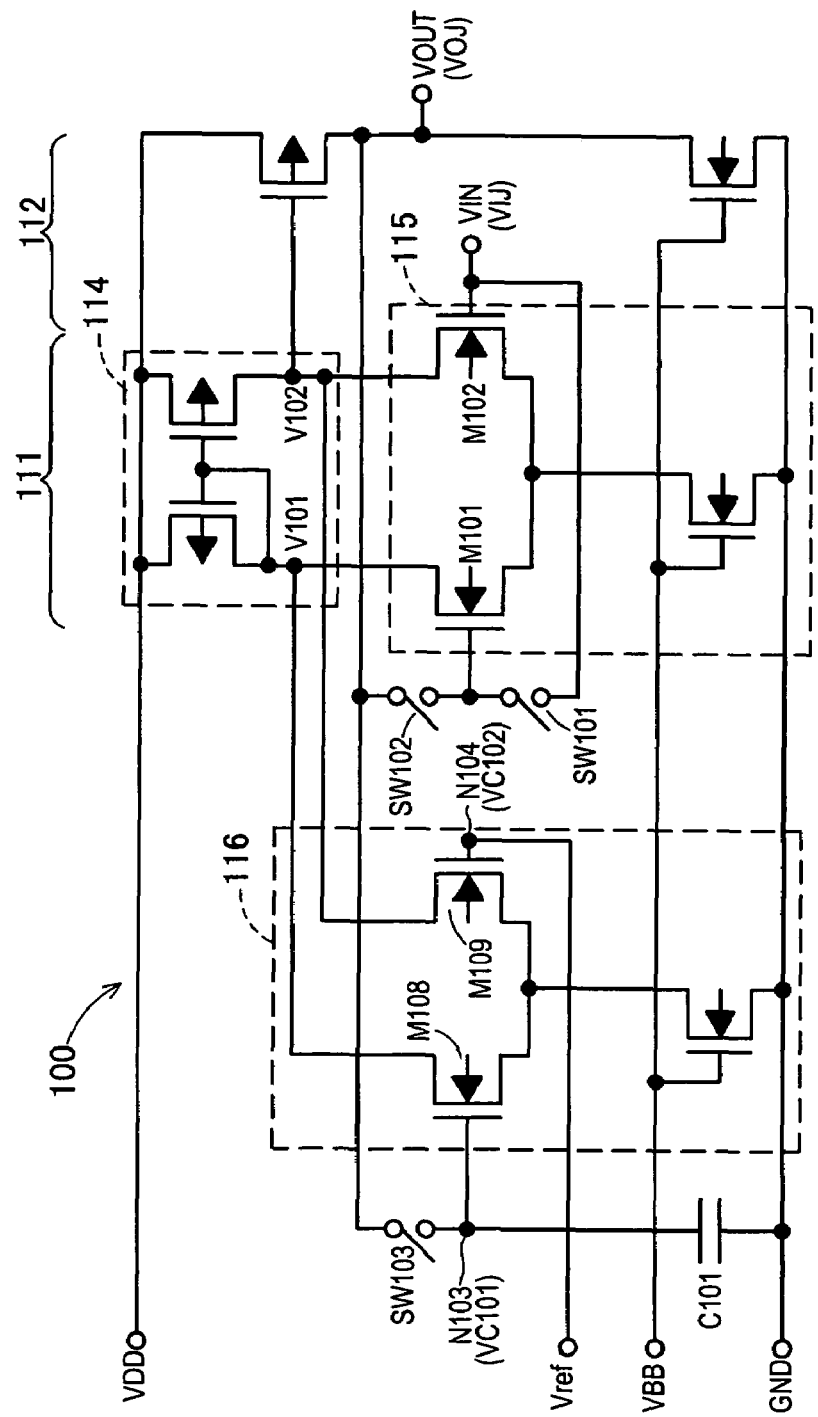
FIG. 10 is a circuit diagram of an operational amplifier equipped with conventional offset cancel function.
Figure 11:
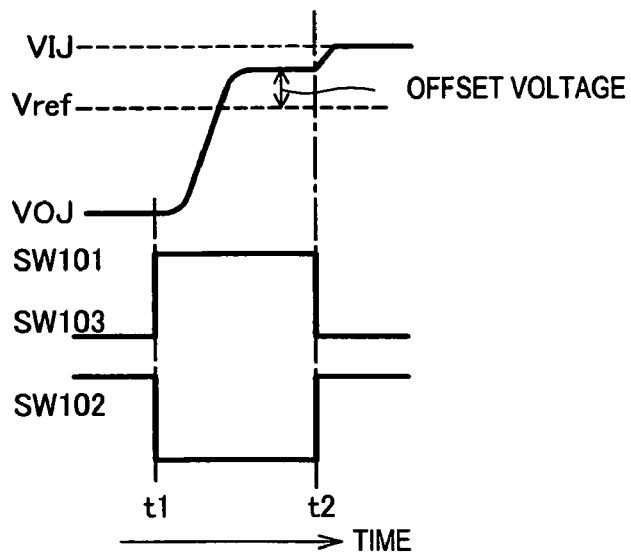
FIG. 11 is a timing chart of the operational amplifier equipped with conventional offset cancel function.
Figure 14:
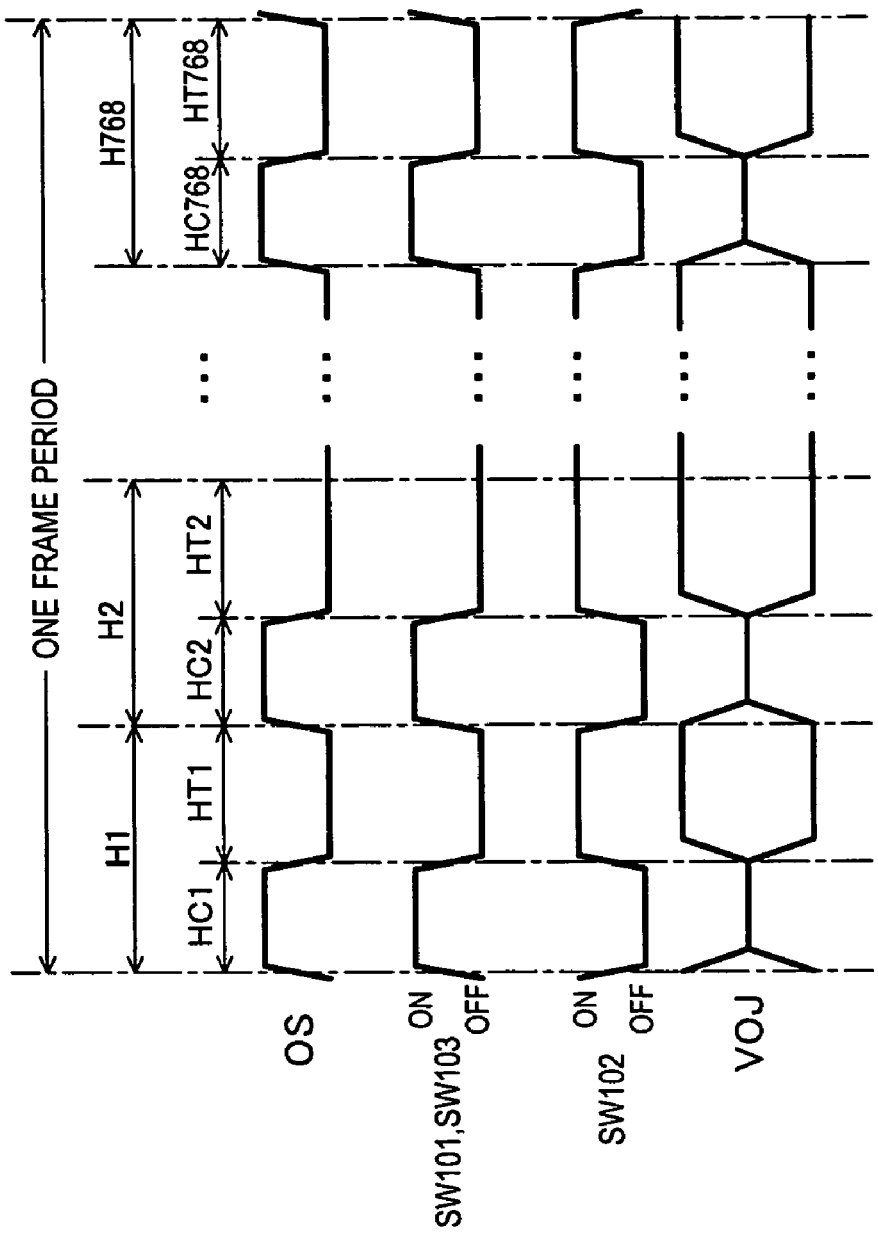
FIG. 14 is a timing chart accounting for operation of the conventional line driver.

FIG. 14 shows a timing chart explaining the operation of the existent line driver 130. One horizontal period H1 has an offset cancel preparation period HC1 and an output period HT1 and an operation of repeating H1, H2, - - - for one horizontal period is conducted. For example, in a case of S-XGA liquid panel (number of pixel: 1024×768), one frame period is constituted with one horizontal periods H1 to H768. Further, each of the operational amplifiers AJ1 to AJ6 is constituted, for example, with an operational amplifier circuit 100 equipped with offset cancel function as shown in FIG. 10. The offset cancel preparatory period HC1 is started corresponding to that the offset cancel control signal OS inputted from a not illustrated signal generator to a block 135 is turned to a high level, by which switch SW101 and SW103 are rendered conductive and a switch SW102 is rendered non-conductive in the operational amplifier circuit 100 (FIG. 10) and offset for the operational amplifiers AJ1 to AJ6 is canceled. Then, the offset cancel preparatory period HC1 is ended corresponding to that the offset cancel control signal OS is turned to a low level, by which the switches SW101 and SW103 are rendered non-conductive and the switch SW102 is rendered conductive. Accordingly, the operational amplifiers AJ1 to AJ6 operate as voltage followers, and the input voltage inputted to the data input terminals DIJ1 to DIJ6 are outputted to the data output terminals DOJ1 to DOJ6. As described above, in the prior art, the offset cancel preparatory period HC and the output period HT are necessary. Then, in the case of the XGA display, one horizontal period H is required to be 20 (µs) or less. The one horizontal period H sometimes includes, for example, an offset cancel preparatory period HC has a value of 2 (µs) and the output period HT 18 (µs). Then, for refining liquid crystal further, it is essential to shorten one horizontal period H more and the presence of the offset cancel preparatory period HC brings about a problem.

Figure 4:
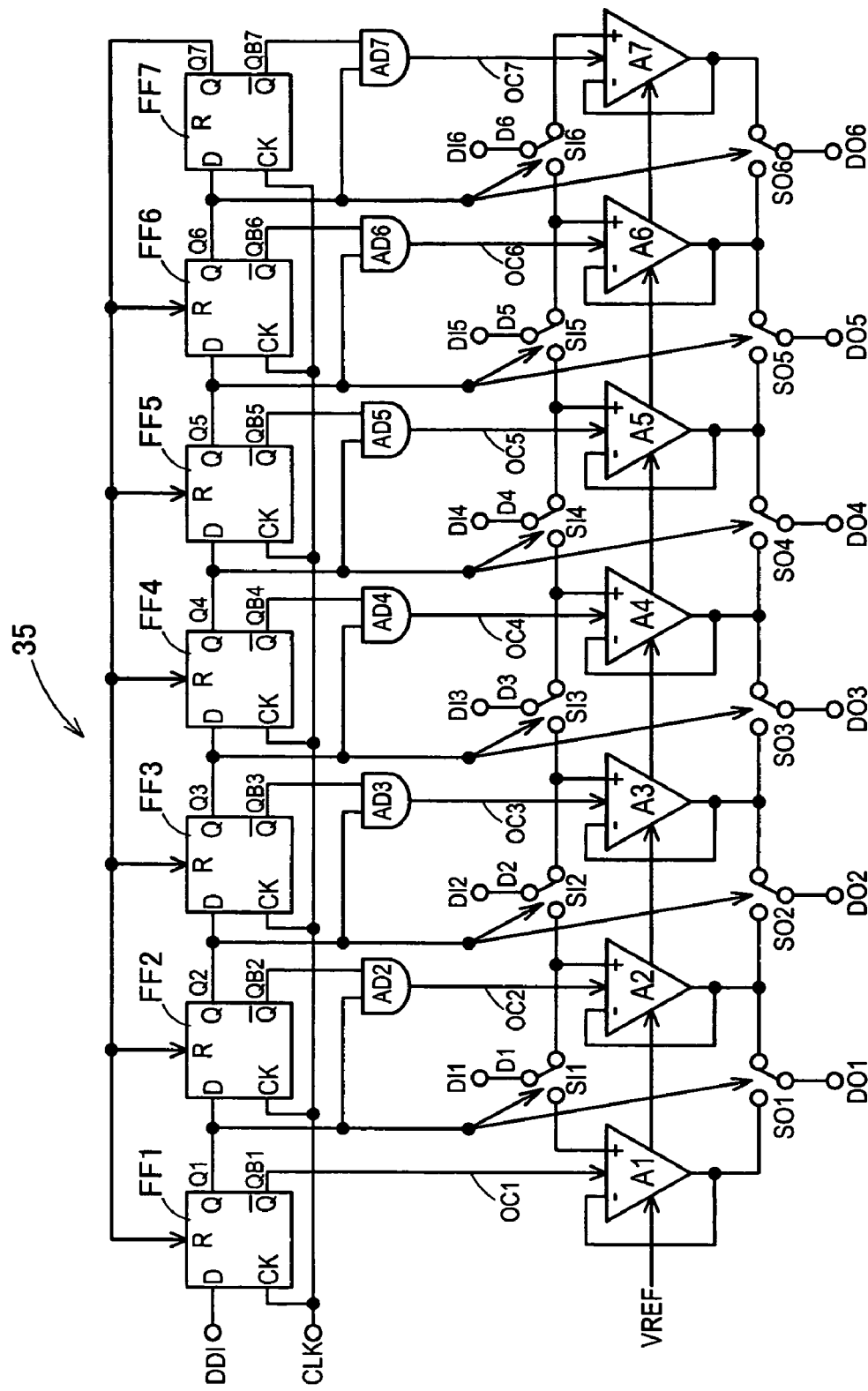
FIG. 4 is a schematic diagram of circuit block directed to the second embodiment.

FIG. 4 shows a schematic diagram for in a case of a 6-input×6-output block 35 in the invention. The block 35 comprises data input terminals DI1 to DI6 and data output terminals DO1 to DO6. Display data D1 to D6 are inputted from the control circuit 150 (FIG. 12) to the data input terminals DI1 to DI6, and display data D1 to D6 are outputted from the data output terminals DO1 to DO6 to the corresponding data line 121 (FIG. 12) respectively. Further, operational amplifiers A1 to A7 that operate as voltage followers are provided between the data input terminals DI and the data output terminals DO by the number of seven which is more than one relative to six sets of the input and output terminals. The data input terminal DI1 is connected selectably to the non-inversion input terminal of the operational amplifier A1 or A2 by the switch SI1. Further, the data output terminal DO1 is connected selectably to the output terminal for the operational amplifier A1 or A2 by a switch SO1. In the same manner, the data input terminals DI2 to DI6 and the data output terminal DO2 to DO6 are also have switches SI2 to SI6 and SO2 to SO6, respectively.

Further, D flip-flops FF1 to FF7 are provided corresponding to the operational amplifiers A1 to A7 which are connected serially to constitute a shift register. A clock signal CLK having one horizontal period cycle is inputted to the clock input terminal CK for each of the D flip-flops. Further, an output signal Q7 of the D flip-flop FF7 at the final stage is inputted as a reset signal to the reset signal input terminal R for each of the D flip-flops FF1 to FF6. Further, outputs Q1 to Q7 of the D flip-flops FF1 to FF6 are inputted to the switches SI1 to SI6, and the switches S01 to S06, respectively. Both the switches SI1 and SO1 are connected to the operational amplifier A2 when the low level output Q1 is inputted and connected to the operational amplifier A1 when the high level output Q1 is inputted. Then, switches SI2 to SI6 and SO2 to SO6 also have the same function.

Further, the complementary output QB1 of the D flip-flop FF1 is inputted as an offset cancel signal OC1 to the operational amplifier A1. Further, the output Q1 of the D flip-flip FF1 and the complementary output QB2 of the D flip-flop FF2 are inputted to AND gate AD2, and the output of the AND gate AD2 is inputted as an offset cancel signal OC2 to the operational amplifier A2. In the same manner, offset cancel signals OC3 to OC7 outputted from the AND gates AD3 to AD7 are inputted to the operational amplifiers A3 to A7. An input signal DD1 is inputted to the input terminal of the D flip-flop FF1. The operational amplifiers A1 to A7 have offset cancel function, and conduct offset cancel operation during high level of the inputted offset cancel signal OCX (X=1 to 7) and conduct usual voltage follower operation during low level thereof.

Figure 5:
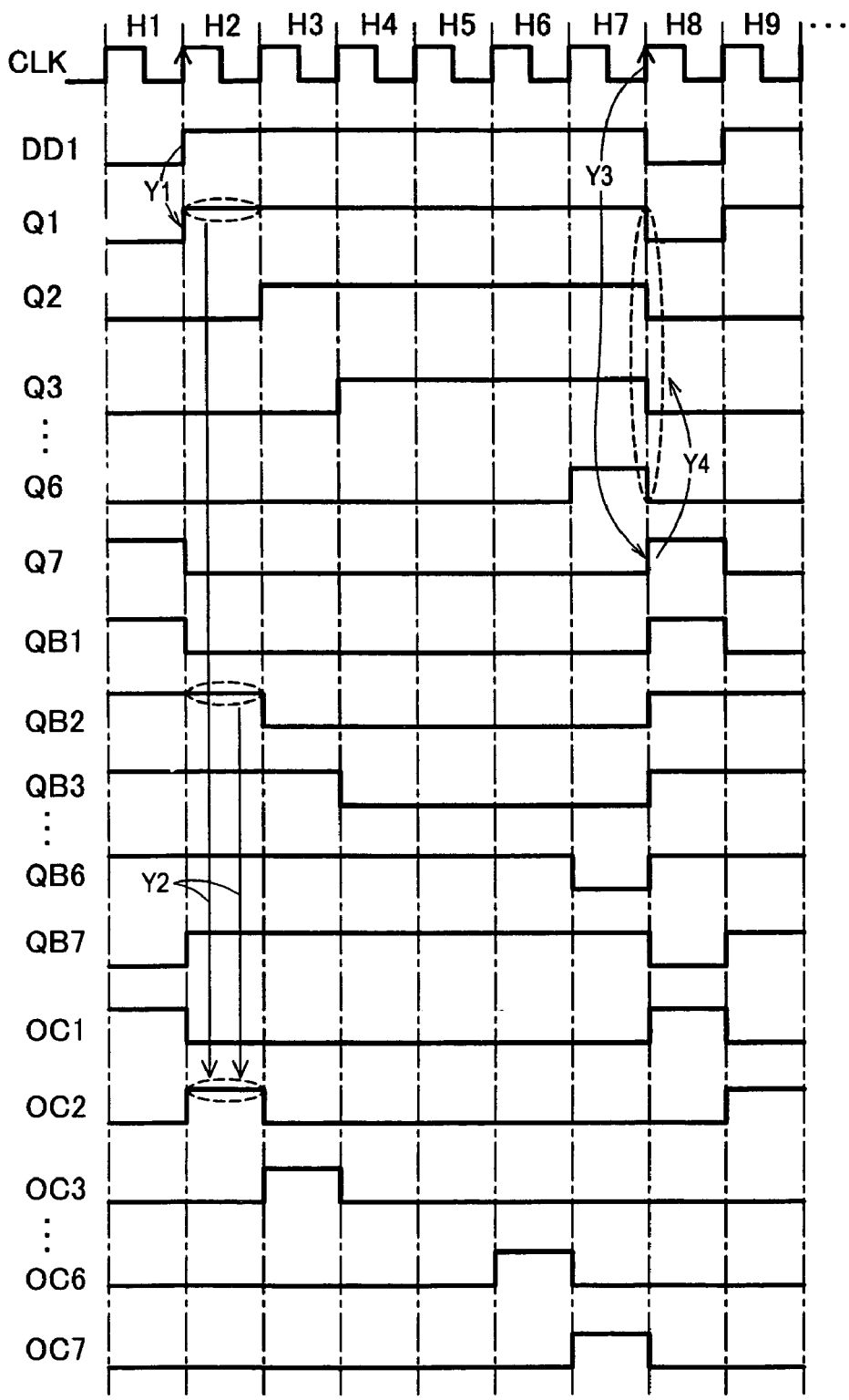
FIG. 5 is a timing chart of circuit block directed to the second embodiment.

The operation is to be described. FIG. 5 shows a timing chart. In FIG. 5, during one horizontal period H1, all outputs Q1 to Q6 of the D flip-flops FF1 to FF6 are at the low level. Accordingly, since both the switches SI1 and SO1 are connected to the operational amplifier A2, the operational amplifier A1 is separated from the input terminal DI1 and the data output terminal DO1, as non-selected operational amplifier. Further, the operational amplifier A2 is connected with the data input terminal DI1 and the data output terminal DO1. Then, the operational amplifier A3 is connected with the data input terminal DI2 and the data input terminal DO2 and the operational amplifiers A4 is connected with the data output terminal DI3 and the data output terminal DO3. In the same manner, the operational amplifier A7 is connected with the data input terminal DI6 and the data output terminal DO6. Further, during one horizontal period H1, since the high level offset cancel signal OC1 (that is, complementary output QB1 of the D flip-flop FF1) is inputted to the operational amplifier A1, the operational amplifier A1 conducts offset cancel operation during one horizontal period H1. Further, since the offset cancel signals OC2 to OC7 are at the low level, the operational amplifiers A2 to A7 conduct voltage follower operation, and the display data D1 to D6 inputted to the data input terminals DI1 to DI6 are outputted from the data output terminals DO1 to DO6.

Then, when it goes to one horizontal period H2, the input signal DD1 turned to the high level by a not illustrated signal generator circuit is inputted to the D flip-flop FF1. The input signal DD1 is a signal repeating the low level at the first one period of the clock signal CLK and the high level in the succeeding six periods. Then, corresponding to that the output Q1 of the D flip-flop FF1 is turned to the high level (arrow Y1), only the switch SI1 and SO1 are switched, so that the connection destination of the data input terminal DI1 and the data output terminal DO1 is changed from the operational amplifier A2 to the operational amplifier A1. In this stage, since switching operation is not conducted in other switches, the connection state is kept for the operational amplifier A3 to A7 to the data input terminals D12 to D16 and the data output terminals D02 to D06, so that only the operational amplifier A2 is completely separated from the data input and output terminals. That is, non-selected operational amplifier is switched from the operational amplifiers from A1 to A2. Further, since the output Q1 of the D flip-flop FF1 and the complementary output QB2 of the D flip-flop FF2 at the high level are inputted to the AND gate AD2, a high level offset cancel signal OC2 is inputted to the operational amplifier A2 (arrow Y2), and the operational amplifier A2 conducts the offset cancel operation during one horizontal period H2. Further, since the offset cancel signals OC1 and OC3 to OC7 are at the low level, the operational amplifiers A1 and A3 to A7 conduct the voltage follower operation to output the image data inputted to the data input terminals DI1 to DI6 to the data output terminals DO1 to DO6.

Then, the same operation is conducted also in one horizontal period H3 to H7. That is, as shown in the switching operation table for the operational amplifiers in FIG. 6, when one horizontal period shifts from H1 to H7, the operational amplifiers A1 to A7 are sequentially set to the non-connected state with the input and output terminals and offset cancel is conducted.

Then, in FIG. 5, when one horizontal period H7 has been lapsed and it goes to one horizontal period H8, the output Q7 of the D flip-flop FF7 is turned to the high level by a rising edge signal of the clock signal CLK (arrow Y3). Since the output Q7 of the D flip-flop FF7 is inputted as a reset signal to the reset signal input terminals R of the D flip-flops FF1 to FF6, all the outputs Q1 to Q6 of the D flip-flops FF1 to FF6 are reset to the low level (arrow Y4), and all the switches SI1 to SI6 and the switches S01 to S06 are switched. That is, in FIG. 6, in one horizontal period H8, they are returned to the identical connection state with that in one horizontal period H1 in which the operational amplifier A1 conducts the offset cancel operation being separated from the data input and output terminals and the display data D1 to D6 are outputted from the operational amplifiers A2 to A7.

Then, the offset cancel operation in the operational amplifier A1 is to be described. The operational amplifier A1 is constituted with an operational amplifier circuit 10a equipped with offset cancel function as shown in FIG. 7. The operational amplifier circuit 10a has a constitution of connecting a node N10 and a node N11 by way of a switch SW6 in addition to the circuit diagram of the existent operational amplifier 100 (FIG. 10). When the operational amplifier A1 conducts the offset cancel operation, since the input terminal VIN and the output terminal VOUT are not connected with the data input terminal DI1 and data output terminal DO1 and the switch SW1 is turned on and the switch SW2 is turned off, the gates for the transistors M1 and M2 are brought into a floating state. In order to prevent this, the reference voltage Vref is supplied to the gates of the transistors M1 and M2. Other constitutions are identical with those in the existent operational amplifier 100 and duplicate descriptions will be omitted.

Figure 8:
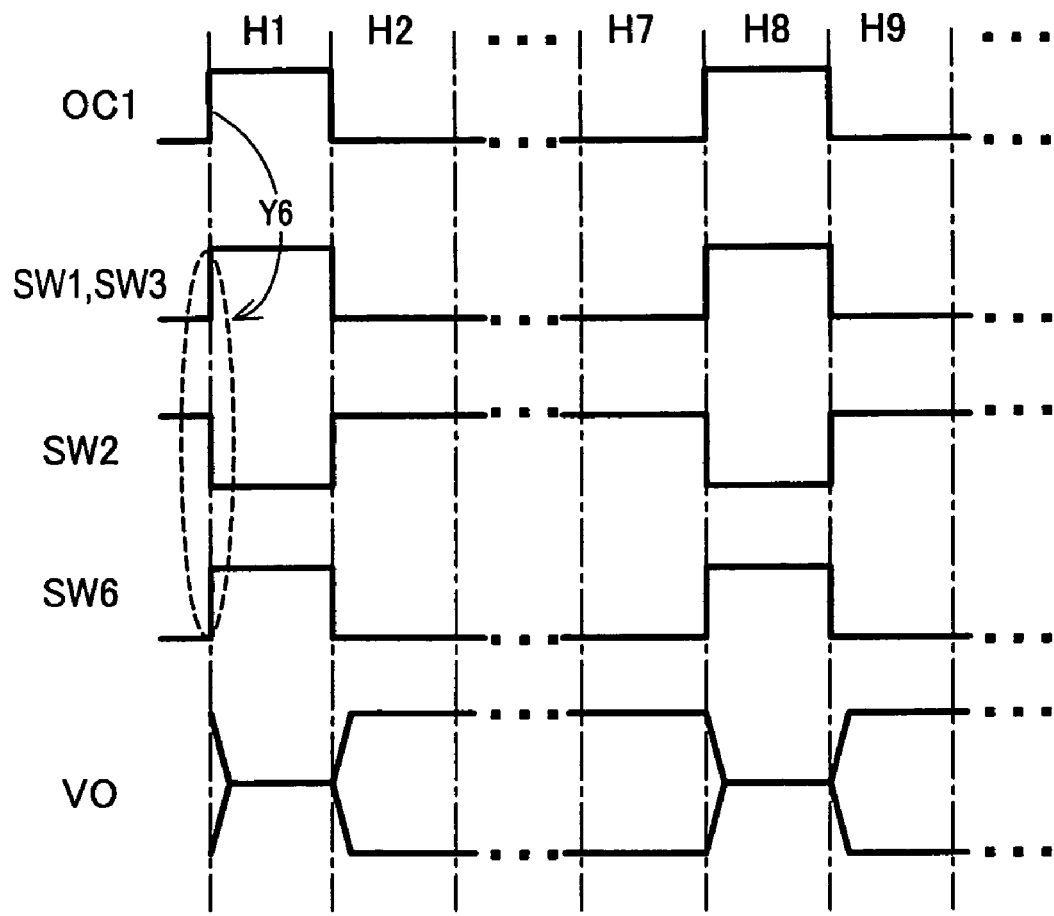
FIG. 8 is a timing chart of the operational amplifier directed to the second embodiment.

FIG. 8 shows a timing chart for the operational amplifier circuit 10a. In one horizontal period H1, a high level offset cancel signal OC1 (that is, complementary output QB1 of D flip-flop FF1) is inputted to the operational amplifier A1, and the switches SW1, SW3 and SW6 are turned on, while the switch SW2 is turned off (arrow Y6) in the operational amplifier circuit 10a corresponding to the high level of the offset cancel signal OC1. Further, in one horizontal period H1, since the input terminal VIN and the output terminal VOUT are not connected with the data input terminal DI1 and data output terminal DO1 (refer to FIG. 4), the reference voltage Vref is supplied by way of the SW6 to the gates of the NMOS transistors M1 and M2. Other operations are identical with those in the existent operational amplifier 100 and offset for the operational amplifier A1 is canceled. In one horizontal periods H2 to H7, the operational amplifier A1 is connected at the input terminal VIN and the output terminal VOUT with the data input terminal DI1 and the data output terminal DO1, to output the inputted display data D1 as the voltage follower. In one horizontal period H8, offset cancel is conducted in the operational amplifier A1 in the same manner as in one horizontal period H1. Subsequently, the same operation is repeated. The operational amplifiers A2 to A7 have the same constitution.

Further, the line driver is constituted having plural input and output terminals as one block and by arranging such plural blocks. For the input and output terminals per one block, terminals by the number of 384 are used for instance. Considering the reasonable interval for the offset cancel preparatory period in the second embodiment with respect to the number of terminals, in a case of one horizontal period of 20 (μs), an offset canceling is conducted once for 384 cycles of one horizontal period (that is, once per 7.7 (ms)) in accordance with the switching operation table for the operational amplifiers in FIG. 6. Further, in the operational amplifier circuit 10a shown in FIG. 7, assuming the capacitance error tolerable as 1 (mV), the capacitance as 500 (fF) and the leak current as 20 (fA) for the first capacitor C1, in the operational amplifier circuit 10a shown in FIG. 7, the time necessary for lowering the voltage by 1 (mV) is 25 (ms). That is, when offset canceling has been completed once, offset is effectively stored for 25 (ms). Accordingly, it can be seen that offset canceling once for 384 period may suffice.

Accordingly, in the liquid crystal display device driving circuit and the liquid crystal display device of the invention, the operational amplifier not used for the output of the display data D1 to D6 is shifted on every one horizontal period and the offset cancel operation has been conducted while it is not used for the output. Then, once the offset cancel operation has been conducted, the obtained offset value is possessed till the next offset cancel operation. Accordingly, it is not necessary to provide the offset cancel preparatory period separately prior to each of the output periods on every one horizontal period and it is no more necessary to incorporate the offset cancel preparatory period in the output period, so that one horizontal period can be shortened further. Accordingly, it is possible to increase the number of the display lines to refine the liquid crystal display device further.

It will be apparent that the invention is not restricted to the embodiments described above and can be improved or modified variously within a range not departing the gist of the invention. In the operational amplifier 10 of the first embodiment (FIG. 1), the first capacitor C1 and the second capacitor C2 are disposed. In a case where the leaking rates of charges accumulated in both of the capacitors are substantially equal with each other, the capacitance of both capacitors can be decreased. This is attributable to the difference of the voltage values between both of the capacitors and the voltage difference between both of the capacitors is possessed even when leaking occurs, in a case where the charge leaking rates are substantially equal between them. On the other hand, in the existent operational amplifier 100, since the capacitor 101 has to keep the voltage difference with respect to the reference voltage Vref as a fixed value, leakage of charges has to be avoided and, accordingly, the capacitance of the capacitor 101 has to be increased. Further, considering that the capacitor requires a larger area in a case where it is prepared on a semiconductor integrated circuit compared with other elements such as transistors, it is possible to reduce the area and decrease the cost for the semiconductor device by decreasing the capacitance of the capacitor in the invention.

Further, when a capacitor using a material of high specific dielectric constant is used for the first capacitor C1 or the second capacitor C2, the area of the capacitor can be decreased while ensuring the capacitance to reduce the area and decrease the cost of the semiconductor device. Further, the capacitance can be increased while keeping the area constant, thereby improving the accuracy of the offset cancel.

Further, for the operational amplifier 10 (FIG. 1), it is possible to adapt a constitution of connecting the node N3 with the power source voltage VDD and the node N3 with the ground voltage GND by way of resistors respectively, and using at least one of the resistors as a resistor variable type memory element. This enables to store the offset value for a longer period of time compared with a method of using the capacitor, making it possible to decrease the frequency of offset cancel.

Further, it has been described for the second embodiment that the operational amplifier A1 is constituted with the operational amplifier circuit 10a equipped with offset cancel function as shown in FIG. 7, but it may also be constituted with the operational amplifier 10 of the first embodiment according to the invention (FIG. 1). In this case, for preventing the gates of the transistors M1 and M2 from the floating state when the operational amplifier A1 conducts offset cancel operation, it is preferred to supply a predetermined voltage by way of a not-illustrated switch to the gates of the transistors M1 and M2.

Further, it has been described for the second embodiment that the operational amplifiers A1 to A7 operating as voltage followers are disposed between the data input terminal DI and the data output terminal DO by the number of seven which is larger by one than the six sets of the input and output terminals, but the invention is not restricted to such a constitution. For example, it can be also constituted that three operational amplifiers A1 to A3 may be disposed to one set of input and output terminals DI1 and DO1, the operational amplifiers A1 to A3 are successively selected by a switch and the constitution described above is disposed to each of the input and output terminals. Since the operational amplifier is selected once per switching for three times, the period for selecting the operational amplifier can be made longer to ensure a sufficient time for conducting offset cancel.

Further, as shown in the switching operation table for the operational amplifiers in FIG. 6, it has been described for the order of offset cancel that operational amplifiers A1 to A7 are successively rendered to the non-connected state with the input and the output terminals from H1 to H7 of one horizontal period and then the offset cancel is conducted, and they are returned to the identical connection state with that in one horizontal period H1 in one horizontal period H8 but the invention is not restricted only thereto. For example, as shown in FIG. 9, it may adopt a mode of repeating the order that the operational amplifiers A1 to A7 are put to offset cancel in the order of increasing the sequential number from one horizontal period H1 to one horizontal period H7, while the operational amplifiers A6 to A1 are put to offset cancel in the order of decreasing the sequential number from one horizontal period H8 to one horizontal period H13.

According to the operational amplifiers, equipped with offset cancel function, the line driver and the liquid crystal display device of the invention, the time till the completion of the feed back control during offset cancel can be shortened and the offset cancel preparatory period can be shortened. Further, the operational amplifier not inputted with the input signal is sequentially shifted on every output periods and the non-selected operational amplifiers not inputted with the input signals are put to offset cancel during non-selected period thereof. Accordingly, there is no more necessary to provide the offset cancel preparatory period prior to each of the output periods.

What is claimed is:

1. A line driver for amplifying at least one input signal in an output period that is repeated periodically, the line driver comprising:

at least two operational amplifiers, the number of operational amplifiers being larger by at least one than number of the at least one input signal; and a switch section for selecting at least one operational amplifier in which the at least one input signal is not input, the switch section switching every output period, wherein offset cancellation is made on the at least one operational amplifier in which the at least one input signal is not input.

2. A line driver for amplifying at least one input signal in an output period that is repeated periodically, the line driver comprising:

operational amplifiers, the number of which is larger by one than the number of the at least one input signal; and switch sections, provided for the at least one input signal, the switch section being configured to input an input signal to any one of two operational amplifiers so as to share the operational amplifiers between adjoining input signals, wherein offset cancellation is made on the operational amplifier to which the input signal is not inputted, and the operational amplifier to which the input signal is not inputted is switched in order every output period.

3. A liquid crystal display device for applying an image data voltage in a horizontal period that is repeated periodically, the liquid crystal display device comprising:

operational amplifiers, the number of which is larger by at least one than number of at least one input signal; and a switch section for selecting the operational amplifier in which the at least one input signal is not input, the switch section switching every output period, wherein offset cancellation is made on the operational amplifier in which the at least one input signal is not input.

* * * * *